(12) United States Patent  (10) Patent No.: US 6,744,123 B2
Koyanagi                   (45) Date of Patent:   Jun. 1, 2004

(54) FILM CARRIER TAPE FOR MOUNTING ELECTRONIC DEVICES THEREON AND METHOD OF MANUFACTURING THE SAME

(75) Inventor: Akira Koyanagi, Shimonoseki (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 0 days.

(21) Appl. No.: 10/394,002

(22) Filed: Mar. 24, 2003

(65) Prior Publication Data

US 2003/0178724 A1 Sep. 25, 2003

(30) Foreign Application Priority Data

Mar. 25, 2002 (JP) ........................................ 2002-083655

(51) Int. Cl.[7] ....................... H01L 23/495; H01L 23/48; H01L 23/04; H01L 23/52; H01L 29/40
(52) U.S. Cl. ........................ 257/668; 257/676; 257/695; 257/730; 257/786
(58) Field of Search ................................. 257/668, 676, 257/695, 730, 786

(56) References Cited

U.S. PATENT DOCUMENTS

| 5,814,879 A | * | 9/1998 | Ishisaka et al. ............. 257/668 |
| 2002/0040761 A1 | * | 4/2002 | Sumida et al. ............ 156/304.3 |
| 2003/0038379 A1 | * | 2/2003 | Kawasaki et al. .......... 257/783 |

* cited by examiner

Primary Examiner—Ngân V. Ngô
(74) Attorney, Agent, or Firm—Sughrue Mion, PLLC

(57) ABSTRACT

The invention provides a film carrier tape for mounting electronic devices thereon, which film carrier tape enables reliable formation of a predetermined wiring pattern in a pattern-forming region and lower production cost. The film carrier tape of the present invention for mounting electronic devices thereon, including an insulating film serving as a tape substrate, and a wiring pattern formed of a conductor layer provided on a surface of the insulating film, the insulating film having a plurality of sprocket holes provided along respective side of longitudinal edges of the wiring pattern, wherein the shortest distance between said sprocket holes and corresponding edges of said wiring pattern is less than 0.7 mm. Thus, production cost of the film carrier tape can be reduced. The invention also provides a method of manufacturing the film carrier tape.

5 Claims, 6 Drawing Sheets

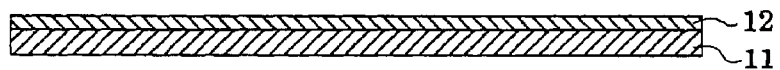
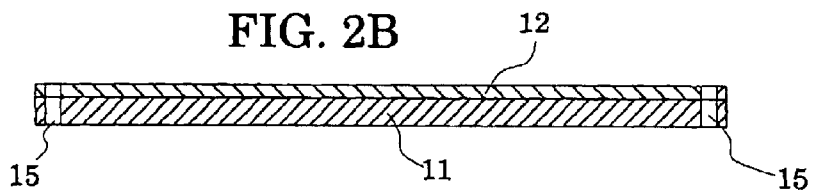
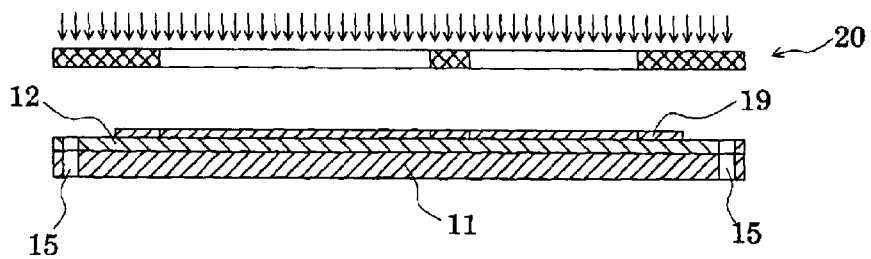
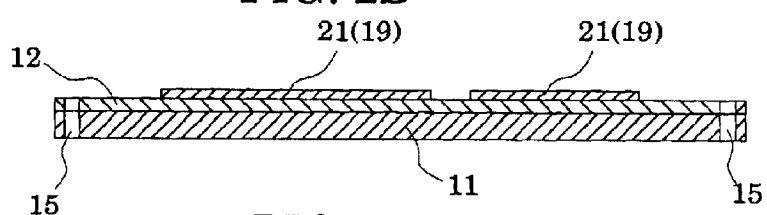
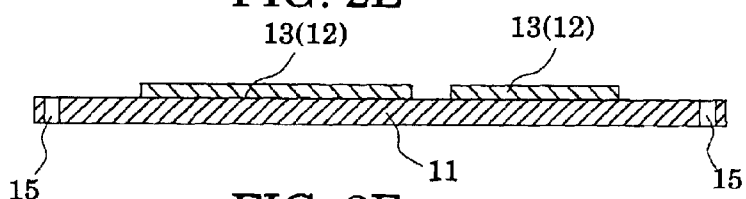
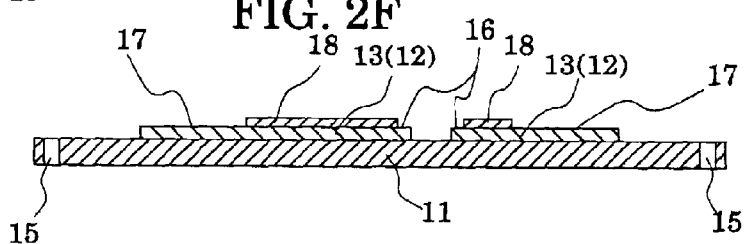
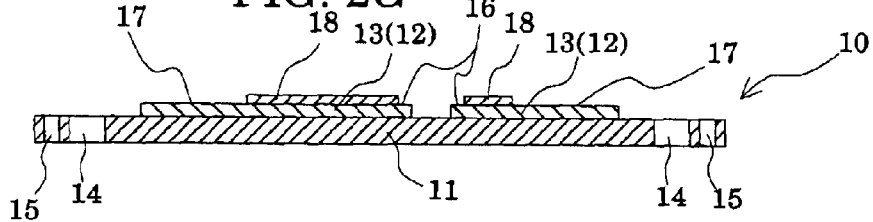

FILM CARRIER TAPE FOR MOUNTING ELECTRONIC DEVICES THEREON AND METHOD OF MANUFACTURING THE SAME

BACKGROUND OF THE INVENTION

1. Field of the Invention

The present invention relates to a film carrier tape on which electronic devices such as ICs and LSIs are to be mounted, and to a method of manufacturing the film carrier tape. TAB (Tape Automated Bonding), COF (Chip On Film), CSP (Chip Size Package), BGA (Ball Grid Array), $\mu$-BGA ($\mu$-Ball Grid Array), FC (Flip Chip), and QFP (Quad Flat Package) are exemplified as the film carrier tape.

2. Description of the Related Art

Development of the electronics industry has been accompanied by sharp demand for printed wiring boards for mounting electronic devices thereon, such as ICs (Integrated Circuits) and LSIs (Large-Scale Integrated circuits). Manufacturers have attempted to realize small-size, lightweight, and high-function electronic equipment, which has long been desired. To this end, manufacturers have recently come to employ a film carrier tape, such as a TAB tape, a T-BGA tape, an ASIC tape, or a COF tape. Use of film carrier tapes has become increasing important, especially for manufacturers of personal computers, cellular phones, and other electronic equipment employing a liquid crystal display (LCD) that must have high resolution and flatness, as well as a narrow screen-frame area.

Generally, the above-described film carrier tape is manufactured by forming a plurality of wiring patterns on a continuous length of insulating film having sprocket holes provided along respective longitudinal edges of the insulating film, while the insulating film is continuously conveyed.

Standards of EIAJ (Electronics Industries Association of Japan) stipulate that insulating films come in standard widths of 35 mm, 48 mm, and 70 mm.

These conventional film carrier tapes can be produced less expensively by reducing the size of the wiring pattern and providing a narrower width insulting film. However, the conventional production method cannot cope with all types of film carrier tapes.

Specifically, according to the conventional method, the wiring pattern is formed between a pair of rows of sprocket holes—which are provided along respective longitudinal edges of the insulating film, which rows of sprocket holes are at the outer sides of the insulating film thereof—while the insulating film is conveyed and positioned by use of the sprocket holes. Accordingly, the width of a pattern-forming region in which the wiring pattern is to be formed is restricted by the transverse distance between the rows of sprocket holes; the given width of the pattern-forming region cannot fully satisfy the transverse measurement of a predetermined wiring pattern to be formed. In addition, a limitation is imposed on the degree of downsizing of the wiring pattern.

Therefore, when a product, whose analogue has been manufactured from a 48-mm-width insulating film according to the conventional technology, is instead manufactured from a 35-mm-width insulating film, some wiring patterns fail to be contained within a limited pattern-forming region, by a minute difference.

SUMMARY OF THE INVENTION

The present inventors have carried out extensive studies in order to solve the aforementioned problems, and have found that the problems can be overcome by use of a film carrier tape for mounting electronic devices thereon which has a specific configuration. The present invention has been accomplished on the basis of this finding.

Thus, an object of the present invention is to provide a film carrier tape for mounting electronic devices thereon which ensures that a predetermined pattern can be contained within a given pattern-forming region and which lowers cost. Another object of the invention is to provide a method of manufacturing the same.

Accordingly, in a first aspect of the present invention, there is provided a film carrier tape for mounting electronic devices thereon, comprising an insulating film serving as a tape substrate, a wiring pattern formed of a conductor layer provided on a surface of the insulating film, and a pair of rows of sprocket holes provided along respective longitudinal edges of the insulating film, which rows of sprocket holes are at the outer sides of the wiring pattern, wherein the shortest distance between said row of sprocket holes and corresponding edges of said wiring pattern is less than 0.7 mm.

Through employing the film carrier tape according to the first aspect, an increased width of the pattern-forming region can be secured, so as to cover the full transverse measurement of a predetermined wiring pattern, thus lowering product cost.

In a second aspect of the present invention, the insulating film may have a plurality of guide holes—which are smaller than the sprocket holes and are to be used in conveyance of film carrier tape during manufacturing of the film carrier tape—provided in such a manner that the guide holes are disposed adjacent to the corresponding longitudinal edges of the insulating film and transversely outward of the sprocket holes.

Through employing the above construction according to the second aspect, since the guide holes can be reduced in size, a required transverse measurement of the pattern-forming region for a predetermined wiring pattern can be secured.

In a third aspect of the present invention, the sprocket holes may be perforated when the insulating film is conveyed and positioned by use of the guide holes.

Through employing the above construction according to the third aspect, the sprocket holes can be perforated in the insulating film surely at predetermined positions after formation of the wiring pattern is completed.

In a forth aspect of the present invention the sprocket holes may be perforated with reference to a plurality of positioning marks for forming sprocket holes, which marks are formed of the conductor layer by etching.

Through employing the above construction according to the forth aspect, the sprocket holes can be reliably perforated in the insulating film at predetermined positions after formation of the wiring pattern is completed.

In a fifth aspect of the present invention, the insulating film may have one or more device holes arranged longitudinally in the center of a pattern-forming region in which the wiring pattern is provided.

According to the fifth aspect, employing the above construction, enables manufacture of various types of film carrier tapes for mounting electronic devices thereon with precise measurements.

According to a sixth aspect of the present invention, there is provided a method of manufacturing a film carrier tape for mounting electronic devices thereon which includes an insulating film, serving as a tape substrate, a wiring pattern formed of a conductor layer provided on a surface of the insulating film, and a pair rows of sprocket holes provided along respective longitudinal edges of the insulating film, which rows of sprocket holes are at the outer sides of the wiring pattern, the method comprising perforating, prior to formation of the wiring pattern, a plurality of guide holes, which are smaller than the sprocket holes and are to be used in conveyance of film carrier tape during manufacturing of the film carrier tape, in the insulating film along the longitudinal edges thereof in such a manner that the perforated guide holes are disposed adjacent to the corresponding longitudinal edges of the insulating film and transversely outward of the sprocket holes; forming the wiring pattern formed of a conductor layer on the insulating film as conveyed and positioned by use of the guide holes, by patterning the conductor layer on the positioned insulating film; and, subsequent to the patterning, perforating the sprocket holes in the insulating film as conveyed and positioned by use of the guide holes.

Through employing the above method according to the sixth aspect, after a predetermined wiring pattern is reliably formed in a widened pattern-forming region, the sprocket holes can be reliably perforated in respective predetermined positions of the insulating film, thus lowering product cost.

In a seventh aspect of the present invention perforation of the guide holes may be carried out by punching through the insulating film and the conductor layer provided on the entire surface of the insulating film.

Through employing the above method according to the seventh aspect, the insulating film can be conveyed and positioned by use of the guide holes.

In a eighth aspect of the present invention, after perforation of the guide holes, the conductor layer may be formed between the guide holes along the respective longitudinal edges of the insulating film, after which forming of the conductor layer forming of the wiring pattern is carried out.

Through employing the above method according to the eighth aspect, the predetermined wiring pattern can be fully formed by increasing the width of a pattern-forming region.

In a ninth aspect of the present invention, the shortest distance between the sprocket holes and corresponding edges of the wiring pattern may be less than 0.7 mm.

Through employing the above method according to the ninth aspect, the predetermined wiring pattern can be fully formed by increasing the width of a pattern-forming region.

In a tenth aspect of the present invention, along with the guide holes, one or more device holes may be perforated by punching through the insulating film.

According to the tenth aspect, employing the above method enables manufacture of various types of film carrier tapes for mounting electronic devices thereon, with precise measurements.

In a eleventh aspect of the present invention, along with the sprocket holes, one or more device holes may be perforated by punching through the insulating film.

According to the eleventh aspect of the present invention, employing the above method enables manufacture of various types of film carrier tapes for mounting electronic devices thereon, with precise measurements.

According to a twelfth aspect of the present invention, there is provided a method of manufacturing a film carrier tape for mounting electronic devices thereon which includes an insulating film, serving as a tape substrate, a wiring pattern which is formed of a conductor layer provided on a surface of the insulating film and on which electronic devices are to be mounted, and a pair of rows of sprocket holes provided along respective longitudinal edges of the insulating film, which rows of sprocket holes are at the outer sides of the wiring pattern, the method comprising forming the wiring pattern by patterning the conductor layer when the insulating film is conveyed and positioned while feed rollers pinch portions thereof that are adjacent to the respective longitudinal edges of the wiring pattern; forming a plurality of positioning marks at each of the sprocket hole positions of the conductor layer; and subsequently perforating the sprocket holes by punching the positioning marks along with the insulating film.

Through employing the above method according to the twelfth aspect, after a predetermined wiring pattern is reliably formed in a widened pattern-forming region, the sprocket holes can be reliably perforated at respective predetermined positions of the insulating film, thus lowering product cost.

In a thirteenth aspect of the present invention, the shortest distance between the sprocket holes and corresponding edges of the wiring pattern may be less than 0.7 mm.

Through employing the above method according to the thirteenth aspect, the predetermined wiring pattern can be fully formed by increasing the width of a pattern-forming region.

In a fourteenth aspect of the present invention, along with the sprocket holes, one or more device holes may be perforated by punching the insulating film.

According to the fourteenth aspect, employing the above method enables manufacture of various types of film carrier tapes for mounting electronic devices thereon, with precise measurements.

BRIEF DESCRIPTION OF THE DRAWINGS

Various other objects, features and many of the attendant advantages of the present invention will be readily appreciated as the same becomes better understood by reference to the following detailed description of the preferred embodiments when considered in connection with the accompanying drawings, in which:

FIGS. 2A through 2G are transverse cross-sectional views illustrating a method of manufacturing the film carrier tape according to the first embodiment;

DETAILED DESCRIPTION OF THE PREFERRED EMBODIMENTS

First Embodiment

Figure 1A:
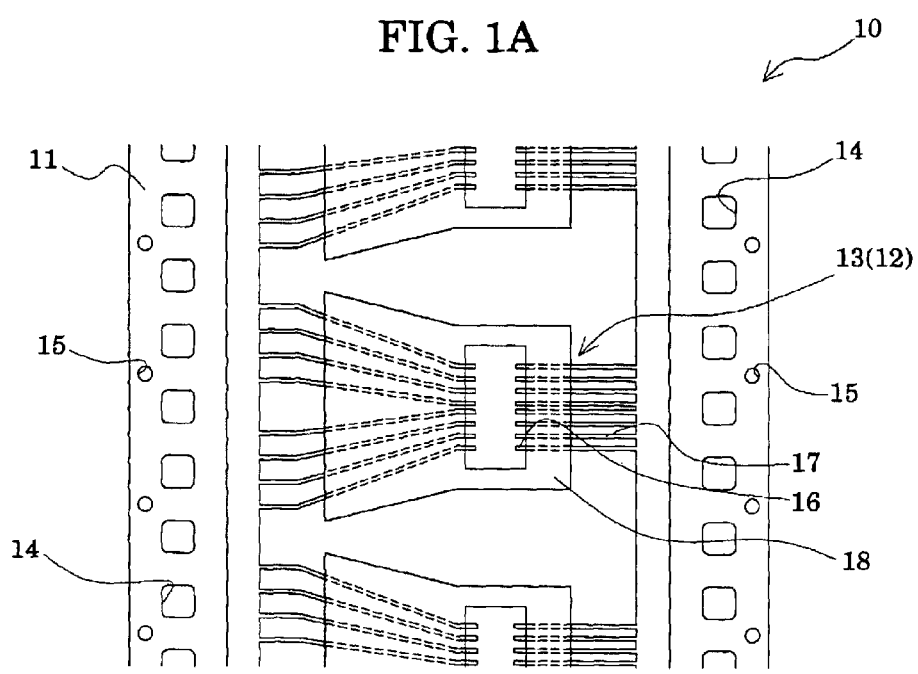
FIGS. 1A and 1B are a plan view and a transverse cross-sectional view, respectively, that schematically show a film carrier tape for mounting electronic devices thereon, according to a first embodiment of the present invention.
Figure 1B:
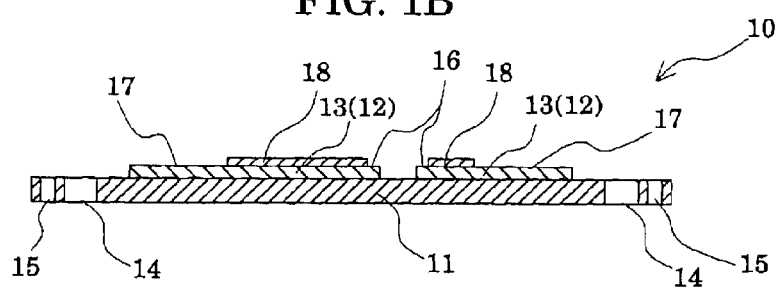

FIGS. 1A and 1B are a plan view and a transverse cross-sectional view, respectively, schematically showing a film carrier tape for mounting electronic devices thereon, according to a first embodiment of the present invention.

As shown in these figures, a film carrier tape 10 for mounting electronic devices thereon is a COF (Chip On Film) in which one or more bare IC chips are mounted directly on a wiring pattern. A wiring pattern 13 formed of a conductor layer 12 is provided on a surface of an insulating film 11 serving as a film carrier tape substrate. The insulator film 11 has a pair of transversely spaced rows of sprocket holes 14 provided along respective longitudinal edges; this is, the two rows of sprocket holes 14 are disposed such that one row extends along each of the longitudinal edges of the insulator film, which rows of sprocket holes 14 are at the outer sides of the wiring pattern 13.

A plurality of guide holes 15, which are to be used in conveyance of the insulating film 11 during manufacturing of the film carrier tape 10, are perforated longitudinally in and along a region adjacent to the respective longitudinal edges of the insulating film 11, outward of the corresponding row of sprocket holes 14.

In the present embodiment, the guide holes 15 are used not only in conveying the insulating film 11 during manufacturing of the film carrier tape 10, but also in positioning the insulating film 11 when the wiring pattern 13 and the sprocket holes 14 are formed as described later. Namely, manufacture of the film carrier tape 10 is carried out by conveying and positioning the insulating film 11 not by use of the rows of sprocket holes 14, but by use of the rows of guide holes 15 disposed outside the rows of sprocket holes 14.

According to the present embodiment, the guide holes 15 assume a circular shape and are smaller than the sprocket holes 14. The diameter of the guide holes 15 is 0.5 to 1.5 mm, preferably about 1.0 mm. No particular limitation is imposed on the shape of the opening of the guide holes 15, and any shape, such as circular, rectangular, or elliptic, is acceptable.

Thus, in the present embodiment, the wiring pattern 13 is formed on the insulating film 11 as the insulating film 11 is conveyed and positioned by use of the guide holes 15 for conveying film carrier tape provided in the regions outside of the sprocket holes 14. Subsequently, the sprocket holes 14 can be perforated at the outer sides of the wiring pattern 13 in the insulating film 11. In case the wiring pattern 13 is formed, the transverse measurement (width) of the pattern-forming region for forming the wiring pattern 13 of the insulating film 11 is not limited by the distance between the two rows of sprocket holes 14. Therefore, an increased width of the prospective pattern-forming region can be secured, thereby lowering product cost.

For example, in the present embodiment, if a 35-mm-width insulating film 11 is used, the maximum width of the pattern-forming region, which according to the conventional technology is only 29 mm, can be increased to 31 mm.

At that time, the shortest distance between each row of the sprocket holes 14 and the corresponding wiring pattern 13 is 0.2 mm, respectively. Although the distance between the wiring pattern 13 and the sprocket holes 14 depends on the type, size, downsize ratio, and other factors of the wiring pattern 13, it can be set to a value less than 0.7 mm, preferably within the range of 0.2 to 0.5 mm.

For the insulating film 11, a variety of materials which exhibit flexibility, chemical resistance, and heat resistance may be used. The material of the insulating film 11 is exemplified by polyester, polyamide, polyimide, and liquid crystal polymer. Particularly, aromatic polyimide (all repeating units being aromatic) having a biphenyl skeleton (e.g., UPILEX, product of Ube Industries, Ltd.) is preferred. The thickness of the insulating film 11 generally falls within a range of 12.5 to 125 $\mu$m, preferably 12.5 to 50 $\mu$m. The width of the insulating film 11 used in the present embodiment is 35 mm.

The wiring pattern 13 formed on the surface of the above-mentioned insulating film 11 has inner leads 16 serving as connecting portions for connection with electronic devices (not illustrated), and outer leads 17 serving as connecting portions for connection with external terminals (not illustrated) of the wiring pattern 13.

Further, the wiring pattern 13 is formed by patterning the conductor layer 12, which is generally formed of copper, aluminum, or nickel. The conductor layer 12 may be formed by stacking directly on the insulating film 11, by thermal press bonding through the medium such as an adhesive-agent layer, or by plating (laminate film). The thickness of the conductor layer 12 falls within the range of, for example, 1 to 70 $\mu$m, preferably 5 to 35 $\mu$m. The conductor layer 12 preferably assumes the form of a copper foil. Alternatively, the insulating film 11 may be formed over such a conductor layer 12 through casting or sputtering. Namely, a material for forming insulating film or its precursor; e.g. a polyimide precursor resin composition, may be applied on the conductor layer 12 coated with a thermoplastic resin or a thermosetting resin, and subsequently dried and heated.

Then, a solder-resist layer 18 is formed on the above-described wiring pattern 13 by applying a solder-resist material coating solution to the wiring pattern 13 except for the inner lead 16 and outer lead 17, and carrying out a predetermined patterning operation. A plating layer (not illustrated) is superposed over the inner lead 16 and the outer lead 17, which are not covered with the solder-resist layer 18.

The material of the solder-resist layer 18 is, for example, a photo-solder resist. The photo-solder resist may be either a negative type or a positive type, so long as the resist exhibits typical photoresist characteristics and conductor foil protection. Particularly, the photo-solder resist is exemplified by a composition of a photosensitive resin such as acrylate resin, particularly epoxy acrylate resin, with an additive such as a photopolymerization initiator. Examples of the epoxy acrylate resin include bisphenol A epoxy acrylate resin, novolak epoxy acrylate resin, bisphenol A epoxy methacrylate resin, and novolak epoxy methacrylate resin. The solder-resist layer 18 may be formed by screen printing by use of a typical thermosetting or UV-setting solder resist material coating solution, which is applied to only a desired region and hardened through exposure to heat or ultraviolet radiation.

A method of manufacturing the above-described film carrier tape 10 according to First Embodiment will now be described with reference to FIGS. 2A through 2G, which are transverse cross-sectional views illustrating a progressive succession of steps of the method.

First, as shown in FIG. 2A, there is prepared a laminate film in which a conductor layer 12 which is to become a wiring pattern 13 is formed on an insulating film 11.

Then, as shown in FIG. 2B, a plurality of guide holes 15 are perforated through the insulating film 11 and the conductor layer 12 by, for example, punching. This perforation of the guide holes 15 may be carried out from the top side of the insulating film 11 or from the bottom side of the insulating film 11.

Subsequently, as shown in FIG. 2C, a photoresist layer 19 is formed on the conductor layer 12 through a customary photolithographic method; a negative-type photoresist material coating solution is applied to a pattern-forming region in which the wiring pattern 13 is to be formed. As a matter of course, a positive-type photoresist material coating solution may be used. During this processing step, in the present embodiment, an increased width of the pattern-forming region can be secured by conveying and positioning the insulating film 11 by use of the guide holes 15.

Further, after conveyance and positioning of the insulating film 11 by use of the guide holes 15, the photoresist layer 19 is exposed through a photomask 20 and developed, to thereby perform patterning, thereby forming a resist pattern 21 for providing a wiring pattern as shown in FIG. 2D.

Then, with the resist pattern 21 serving as a mask pattern, the conductor layer 12 is dissolved and removed by an etching solution, whereupon the resist pattern 21 is dissolved and removed by an alkaline solution. As a result, a wiring pattern 13 is formed as shown in FIG. 2E.

Subsequently, as shown in FIG. 2F, a solder resist layer 18 is formed through, for example, screen printing.

Finally, as shown in FIG. 2G, after the insulating film 11 has been conveyed and positioned by use of the guide holes 15, a plurality of sprocket holes 14 are perforated through the insulating film 11 by, for example, punching, thus completing the film carrier tape 10 of the present embodiment.

As described above, according to the method of the present embodiment, because the insulating film 11 is conveyed and positioned by use of the guide holes 15 perforated in the regions outside the portions in which the sprocket holes 14 are to be perforated, the regions being adjacent to the respective longitudinal edges of the insulating film 11, the sprocket holes 14 can be perforated after formation of the wiring pattern 13 and the solder-resist layer 18. Namely, use of the guide holes 15 to convey and position the insulating film 11 eliminates the limit imposed by the transverse distance between the rows of sprocket holes 14, so that the pattern-forming region can be widened.

When the size of the wiring pattern is reduced, a product, whose analogue has been manufactured from, for example, a 48-mm-width (tape) insulating film according to the conventional technology, can be manufactured from a 35-mm-width (tape) insulating film 11 instead, using this technique. Therefore the price of the film carrier tape 10 can be lowered.

Even if the width of an insulating tape is changed from 70 mm to 48 mm, the same results can be achieved. As described above, standards of EIAJ (Electronics Industries Association of Japan) stipulate that insulating films come in standard widths of 35 mm, 48 mm, and 70 mm.

As described above, in the present embodiment, the guide holes 15 are perforated in the insulating film 11, and the conveyance and positioning of the film carrier tape 10 is carried out by use of the guide holes 15, which are to be used in conveyance of film carrier tape during manufacture of the film carrier tape. The present invention should by no means be limited to this illustrated example, and the insulating film 11 may be devoid of the guide holes 15, so long as it can be conveyed and positioned by an alternative means.

Second Embodiment

Another example, in which a film carrier tape for mounting electronic devices thereon is manufactured as a guide-hole-less insulating film 11 that is conveyed and positioned, will now be described in detail with reference to FIGS. 3A through 3E and FIG. 4. FIGS. 3A through 3E are transverse cross-sectional views illustrating a method of manufacturing a film carrier tape for mounting electronic devices thereon, according to Second Embodiment of the present invention. FIG. 4 is a plan view showing the film carrier tape being manufactured by the method of FIG. 3D.

Figure 3A:
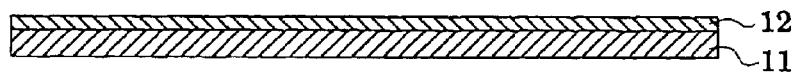
FIGS. 3A through 3E are transverse cross-sectional views illustrating a method of manufacturing a film carrier tape for mounting electronic devices thereon, according to a second embodiment of the present invention.
Figure 4:
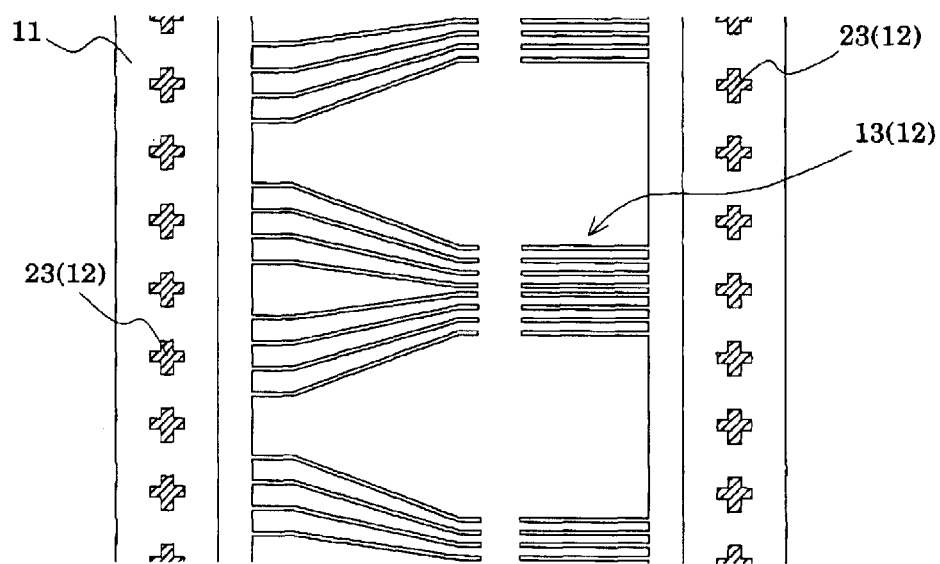
FIG. 4 is a plan view showing the film carrier tape being manufactured by the method with reference to FIG. 3D according to the second embodiment.

First, as shown in FIG. 3A, a laminate film is prepared in which a conductor layer 12 to serve as a wiring pattern 13 is formed on an insulating film 11, in a manner similar to First Embodiment.

Figure 3B:
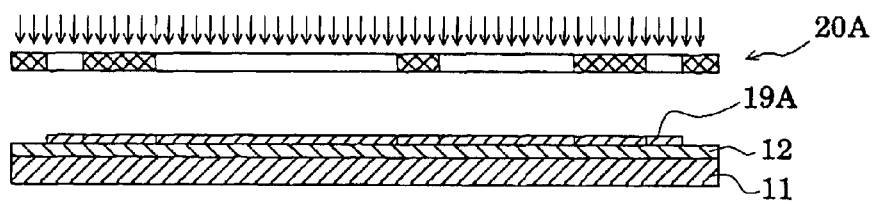

Then, after the insulating film 11 is conveyed and positioned to a predetermined position by means of feed rollers (not illustrated) pinching the insulating film 11 at film portions about 1.0 mm apart from the corresponding longitudinal tape edges, as shown in FIG. 3B, a photoresist layer 19A is formed on the conductor layer 12 through a routine photolithographic method; a negative-type photoresist coating solution is applied to a pattern-forming region in which the wiring pattern 13 is to be formed.

Figure 3C:
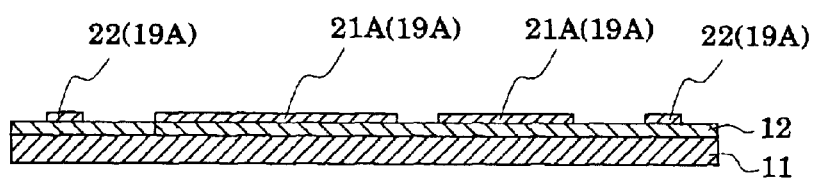

Further, after positioning of the insulating film 11 by the non-illustrated feed rollers, the photoresist layer 19A is exposed through a photo-mask 20A and developed, to thereby perform patterning, thereby forming a resist pattern 21A for the prospective wiring pattern and a resist pattern 22 for later-described sprocket holes, as shown in FIG. 3C.

Figure 3D:
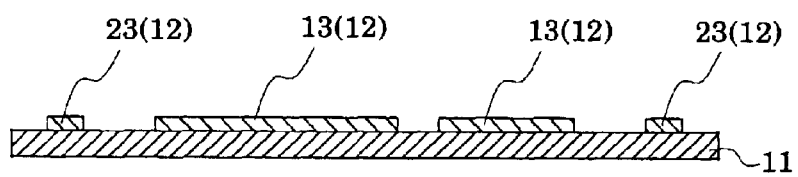

Then, by use of the resist pattern 21A for wiring and the resist pattern 22 for providing sprockets serving as mask patterns, the conductor layer 12 is dissolved and removed by an etching solution, whereupon the resist pattern 21A and the resist pattern 22 are dissolved and removed by an alkaline solution. As a result, a wiring pattern 13 and a plurality of positioning marks 23 for forming the later-described sprocket holes are formed as shown in FIG. 3D. In the present embodiment, each of the positioning marks 23 for providing sprockets has the shape of a cross (FIG. 4) whose lines fall within the perimeter of the individual sprocket hole 14. Positioning marks 23 may be formed subsequent to forming the wiring pattern 13.

Figure 3E:
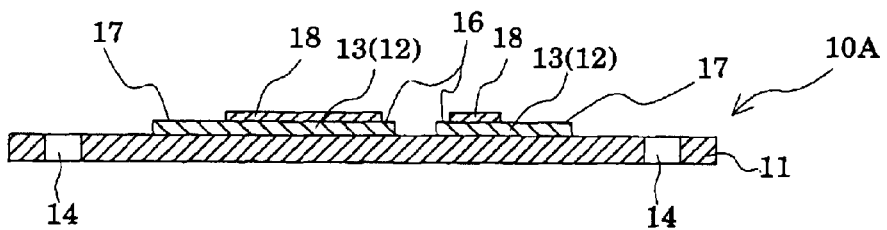

Subsequently, as shown in FIG. 3E, a solder resist layer 18 is formed by, for example, screen (process) printing.

Finally, after the insulating film 11 is positioned by the non-illustrated feed rollers, the positioning marks 23 for providing sprockets are recognized by use of, for example, a non-illustrated automated recognition apparatus and then the sprocket holes 14 are perforated through the insulating film 11 and the positioning marks 23 by, for example, punching, thus completing the film carrier tape 10A of the present embodiment.

As described above, conveyance and positioning of the insulating film 11, with its portions adjacent to the respective longitudinal edges being pinched by feed rollers, eliminates the limit imposed by the transverse distance between the rows of sprocket holes 14 so that the pattern-forming region in the insulating film 11 can be widened. Therefore, the cost of the film carrier tape 10A can be lowered.

Third Embodiment

Figure 5A:
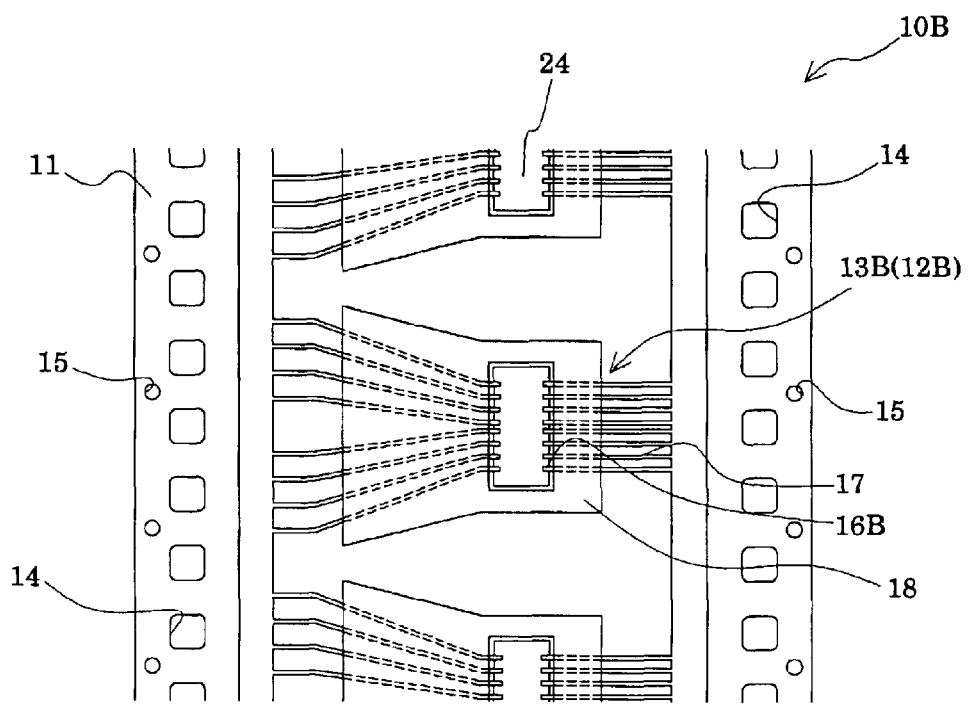
FIGS. 5A and 5B are a plan view and a transverse cross-sectional view, respectively, schematically showing a film carrier tape for mounting electronic devices thereon, according to a third embodiment of the present invention.
Figure 5B:
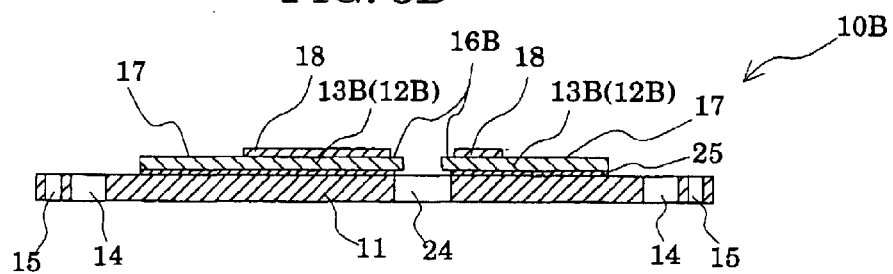

FIGS. 5A and 5B are a plan view and a transverse cross-sectional view, respectively, schematically showing a film carrier tape for mounting electronic devices thereon, according to Third Embodiment of the present invention.

As shown in the figures, the film carrier tape 10B of the present embodiment is similar to the film carrier tape 10 of First Embodiment, except that the film carrier tape 10B is a TAB tape having one or more device holes 24. Thus, portions or elements having the same functions are denoted by the same reference numerals as those employed in First Embodiment, and repeated description thereof are omitted.

In the film carrier tape 10B of the present embodiment, as shown in FIGS. 5A and 5B, the device holes 24, which, as described later, are to be used in bonding electronic devices, are formed in the insulating film 11 at its central portion. A plurality of inner leads 16B, which are to serve as connecting terminals of a wiring pattern 13B on the device side, extend in the device holes 24 so as to project by a predetermined extent.

The wiring pattern 13B is formed on the surface of the insulating film 11 by superposing a conductor layer 12B over the surface of the insulating film 11 with an adhesive layer 25 of, for example, a thermoplastic or thermosetting resin sandwiched therebetween, and then patterning the conductor layer 12B.

Even in the film carrier tape 10B for TAB, perforation of the guide holes 15, which are to be used in conveyance of film carrier tape during manufacture of the film carrier tape, outside the portion in which the sprocket holes 14 are to be perforated secures an increased transverse measurement of the pattern-forming region of the insulating film 11 between the rows of the guide holes 15 during the forming of the wiring pattern 13B and lowers product cost.

A method of manufacturing the above-described film carrier tape according to Third Embodiment will now be described in detail with reference to FIGS. 6A through 6F, which are transverse cross-sectional views illustrating a progressive succession of steps of the method.

Figure 6A:
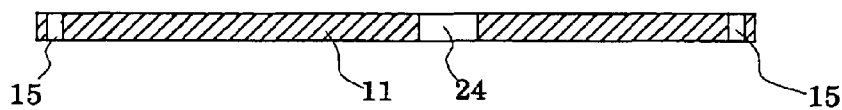
FIGS. 6A through 6F are transverse cross-sectional views illustrating a method of manufacturing the film carrier tape according to the third embodiment.

First, as shown in FIG. 6A, a pair of rows of guide holes 15 and a row of device holes 24 are formed through the insulating film 11 by, for example, punching.

Figure 6B:
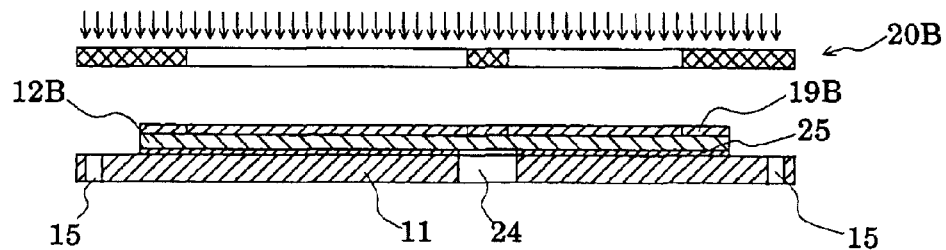

Then, as shown in FIG. 6B, a conductor layer 12B is superposed over the surface of the insulating film 11 at a region between the rows of the guide holes 15 with an adhesive layer 25 of a resin material sandwiched between the conductor layer 12B and the insulating film 11.

Figure 6C:
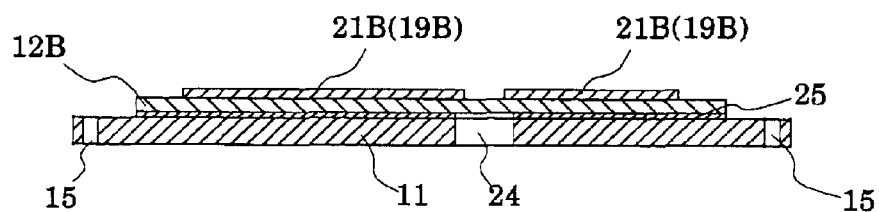
Figure 6D:
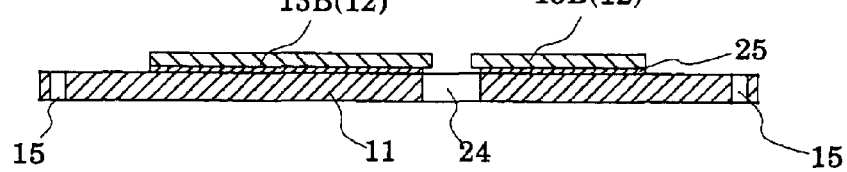

Subsequently, as shown in FIGS. 6B through 6D, as the insulating film 11 is conveyed and positioned by use of the guide holes 15, a photoresist layer 19B is formed on the conductor layer 12B, and the photoresist layer 19B is exposed and developed through a photo-mask 20B, thereby forming a resist pattern 21B for forming a wiring pattern described below. Then, a wiring pattern 13B is formed by etching the conductor layer 12B at the portions that are not covered with the resist pattern 21B.

Figure 6E:
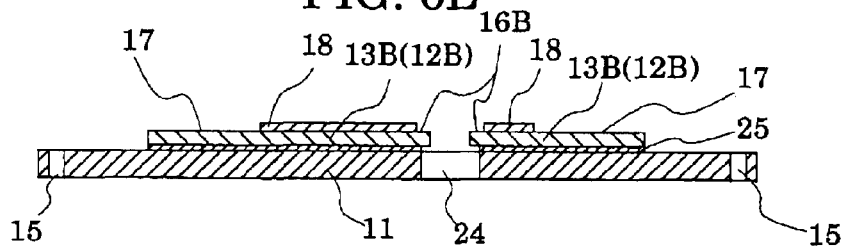
Figure 6F:
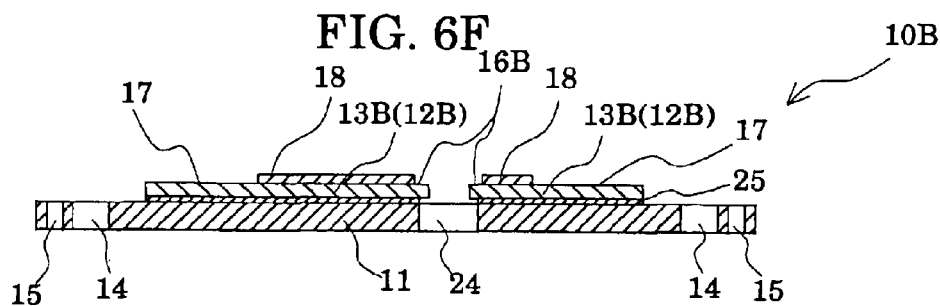

Then, as shown in FIG. 6E, a solder-resist layer 18 is formed on the wiring pattern 13B. Finally, after the insulating film 11 is conveyed and positioned by use of the guide holes 15, a pair of rows of sprocket holes 14 are perforated through the insulating film 11 by, for example, punching, thus as shown in FIG. 6F, completing the film carrier tape 10B of the present embodiment.

As described hereinabove, also in the present embodiment, since conveyance and positioning of the insulating film 11 is carried out by use of the guide holes 15, the limit imposed by the transverse distance between the rows of sprocket holes 14 can be eliminated, thereby securing an increased width of the pattern-forming region. Therefore, the same results as in First Embodiment can be attained.

According to the present invention, the limit imposed by the transverse distance between the rows of sprocket holes can be eliminated, and hence the pattern-forming region can be widened. Therefore, the price of the film carrier tape can be lowered.

It is to be noted that the present invention is not limited to the illustrated embodiments, and various changes or modifications may be suggested without departing from the gist and scope of the invention as defined in the appended claims.

What is claimed is:

1. A film carrier tape for mounting electronic devices thereon, comprising an insulating film serving as a tape substrate, a wiring pattern formed of a conductor layer provided on a surface of the insulating film, and a pair of rows of sprocket holes provided along respective longitudinal edges of the insulating film, which rows of sprocket holes are at the outer sides of the wiring pattern, wherein the shortest distance between said row of sprocket holes and corresponding edges of said wiring pattern is less than 0.7 mm.

2. A film carrier tape for mounting electronic devices thereon according to claim 1, wherein the insulating film has a plurality of guide holes, which are smaller than the sprocket holes and are to be used in conveyance of film carrier tape during manufacturing of the film carrier tape, provided in such a manner that the guide holes are disposed adjacent to the corresponding longitudinal edges of the insulating film and transversely outward of the sprocket holes.

3. A film carrier tape for mounting electronic devices thereon according to claim 2, wherein the sprocket holes are perforated when the insulating film is conveyed and positioned by use of the guide holes.

4. A film carrier tape for mounting electronic devices perforated with reference to a plurality of positioning marks for forming sprocket holes, which marks are formed of the conductor layer by etching.

5. A film carrier tape for mounting electronic devices thereon according to any one of claims 1 to 4, wherein the insulating film has one or more device holes arranged longitudinally in the center of a pattern-forming region in which the wiring pattern is provided.

* * * * *